United States Patent
McDevitt et al.

(10) Patent No.: US 6,518,643 B2
(45) Date of Patent: Feb. 11, 2003

(54) TRI-LAYER DIELECTRIC FUSE CAP FOR LASER DELETION

(75) Inventors: Thomas L. McDevitt, Underhill, VT (US); Anthony K. Stamper, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/816,278

(22) Filed: Mar. 23, 2001

(65) Prior Publication Data

US 2002/0135043 A1 Sep. 26, 2002

(51) Int. Cl.[7] .............................................. H01L 29/00
(52) U.S. Cl. ........................ 257/529; 257/209; 438/132; 438/215; 438/281; 438/333
(58) Field of Search ................................ 438/132, 215, 438/281, 333, 467, 601; 257/529, 209

(56) References Cited

U.S. PATENT DOCUMENTS

| | | | |
|---|---|---|---|
| 4,826,785 A | * 5/1989 | McClure et al. ................ 438/6 |
| 4,873,506 A | 10/1989 | Gurevich | |
| 5,169,802 A | 12/1992 | Yeh | |
| 5,420,455 A | 5/1995 | Gilmour et al. | |
| 5,422,309 A | 6/1995 | Zettler et al. | |
| 5,523,253 A | 6/1996 | Gilmour et al. | |
| 5,539,255 A | 7/1996 | Cronin | |
| 5,663,590 A | 9/1997 | Kapoor | |
| 5,731,624 A | 3/1998 | Motsiff et al. | |
| 5,795,819 A | * 8/1998 | Motsiff et al. ............... 438/618 |
| 5,895,262 A | * 4/1999 | Becker et al. ............... 438/601 |
| 5,960,254 A | 9/1999 | Cronin | |
| 6,004,834 A | * 12/1999 | Tsukude et al. ............ 438/132 |
| 6,104,079 A | * 8/2000 | Stamper ..................... 257/529 |
| 6,107,178 A | * 8/2000 | Becker et al. ............... 438/601 |
| 6,160,302 A | * 12/2000 | Palagonia .................... 257/529 |
| 6,174,753 B1 | * 1/2001 | Liao ........................... 438/132 |
| 6,235,557 B1 | * 5/2001 | Manley ...................... 328/132 |
| 6,239,455 B1 | * 5/2001 | Becker et al. ............... 257/529 |
| 6,259,147 B1 | * 7/2001 | Iwamoto et al. ............ 257/529 |
| 6,300,252 B1 | * 10/2001 | Ying et al. .................. 438/723 |
| 6,372,556 B1 | * 4/2002 | Ko ............................. 438/132 |
| 2001/0005604 A1 | * 6/2001 | Lee et al. ................... 438/132 |

OTHER PUBLICATIONS

IBM Technical Disclosure Bulletin, vol. 32, No. 3A, Aug. 1989, Fuse Structure for Wide Fuse Materials Choice, pp. 438–439.

IBM Technical Disclosure Bulletin, vol. 32, No. 3A, Aug. 1989, Concurrent Double Level Wiring Process, pp. 433–435.

IBM Technical Disclosure Bulletin, vol. 32, No. 8A, Jan. 1990, Method to Incorporate Three Sets of Pattern Information in Two Photomasking Steps, pp. 218–219.

* cited by examiner

Primary Examiner—David Nelms
Assistant Examiner—Andy Huynh
(74) Attorney, Agent, or Firm—Schmeiser, Olsen & Watts; Mark F. Chadurjian

(57) ABSTRACT

A substrate having at least one fuse in a fuse layer. An upper etch-stop layer over the fuse, a lower etch-stop layer having a different etch-chemistry over the fuse and, optionally, a diffusion barrier layer immediately over the fuse. The lower etch-stop later and the optional diffusion barrier providing a uniform passivation thickness for use in conjunction with laser fuse deletion processes. An upper etch-resistant layer over the lower etch-resistant layer and having an etch chemistry selective to that of the lower etch-resistant layer. Methods for providing a uniform passivation thickness over all the fuses, and for deleting such fuses.

15 Claims, 4 Drawing Sheets

TRI-LAYER DIELECTRIC FUSE CAP FOR LASER DELETION

BACKGROUND OF THE INVENTION

1. Technical Field

The present invention relates generally to integrated circuits having Back End of Line (BEOL) structures including fuse elements, and more particularly, to a laser fuse deletion process including forming a dielectric cap of known thickness over the fuse.

2. Related Art

Fuses formed within small electronic structures can serve several functions. For example, fuses may be formed within a structure to support higher production yields through redundancy. In other words, particular fuses may be deleted or opened to re-route circuitry along alternate pathways in the event of a failure. Alternatively, fuses may be selectively deleted to form a matrix of opens and shorts unique to that circuit which may easily be recognized by an electrical computer identification system.

Laser fusing processes are typically used to delete specific fuses. During a laser fuse deletion process the fuse structure, including the size, shape and material of the fuse itself, as well as the type and thickness of the material covering the fuse, are of critical importance to the quality of the fuse deletion. Accordingly, it is desirable to optimize any or all of these parameters to enhance the success of the fuse deletion process.

SUMMARY OF THE INVENTION

The first general aspect of the present invention provides an electronic structure comprising a substrate including a fuse formed within the substrate; and a first etch-resistant layer over the fuse; and a second etch-resistant layer over the fuse, wherein the second etch-resistant layer is adjacent to the first etch-resistant layer and is between the first etch-resistant layer and the fuse.

The second general aspect of the present invention provides a method of forming a fuse structure, comprising providing a fuse layer having a fuse formed therein; and depositing a lower etch-resistant layer over a surface of the fuse layer; and depositing an upper etch-resistant layer over the lower etch-resistant layer.

The third general aspect of the present invention provides a method of performing a fuse deletion, comprising: providing a substrate including at least one fuse therein, a lower etch-resistant layer over the fuse and an upper etch-resistant layer over and adjacent to the lower etch resistant layer and at least one insulative layer over the upper etch-resistant layer; and removing a portion of the at least one insulative layer above the fuse to the upper etch-resistant layer; and removing a portion of the upper etch-resistant layer above the fuse to the lower etch-resistant layer; and applying a radiant energy source to the fuse until the fuse is deleted.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. In particular, references to exemplary elements depicted as single specimen in the cutaway figures, such as contact pads, fuses, openings, etc. are intended to extend to any plurality of such elements as may be provided in real circuit. Although the drawings are intended to illustrate the present invention, the drawings are not necessarily drawn to scale. The term "oxide" as used alone herein refers to a semiconductor oxide (e.g., silicon dioxide, unless the contrary is specifically indicated). The term "nitride" as used alone herein refers to a semiconductor nitride (e.g., silicon) and not a metal nitride such as titanium nitride, unless the contrary is specifically indicated.

Figure 1:
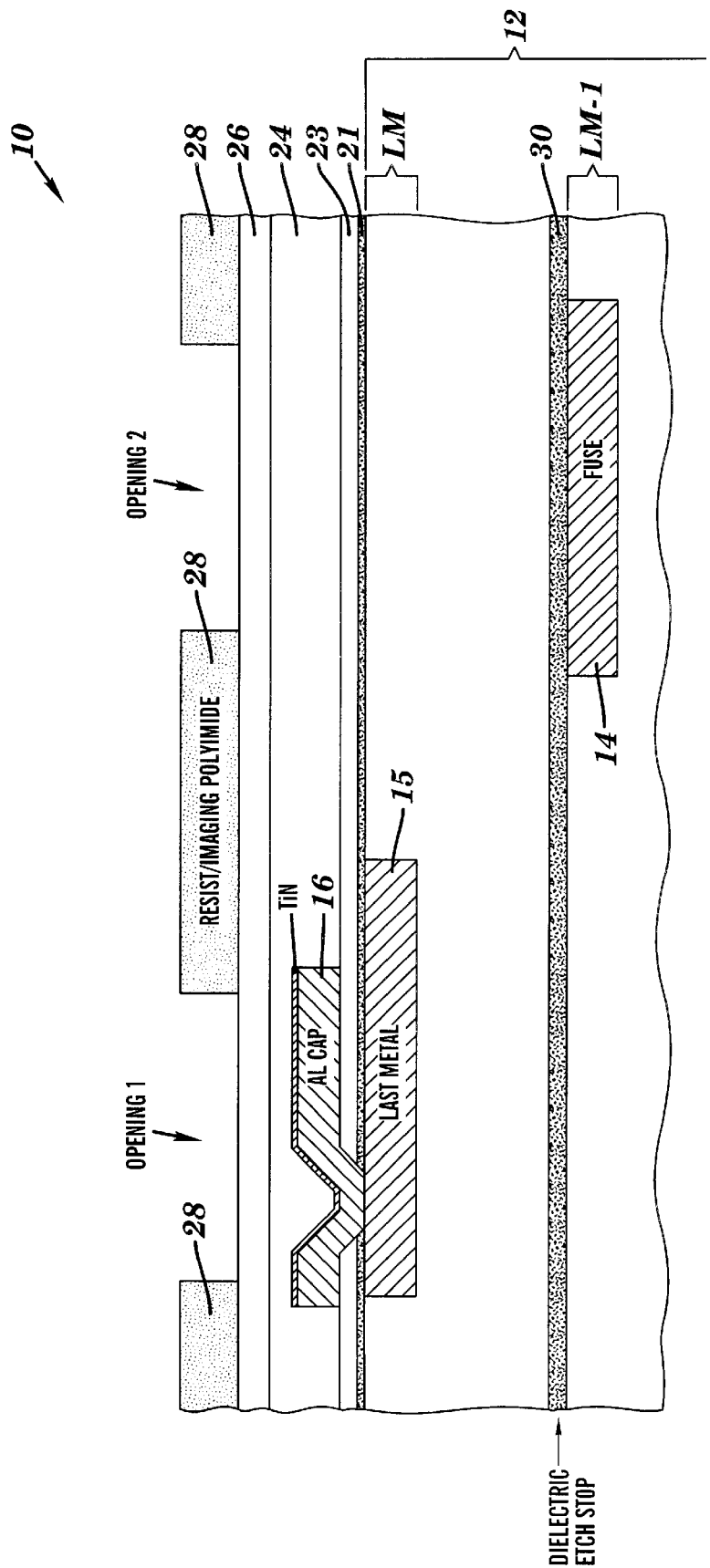
FIG. 1 depicts a cross-sectional view of a related art structure.

Referring to the drawings, FIG. 1 shows a cross-sectional view of a related art structure 10, e.g., a Back-End-of-the-Line (BEOL) electronic structure including a fuse 14. The electronic structure 10 is associated with an integrated circuit and may be formed over a semiconductor chip while the chip is part of a semiconductor wafer (not shown) containing a plurality chips, each containing a similar or identical integrated circuit (IC) wherein each individual IC is eventually separated from other ICs on the wafer prior to shipping, by cutting the wafer into the plurality of chips. The structure comprises an underlying substrate 12, a contact pad 16 and standard final passivation dielectric stack. Any known standard final passivation dielectric stack could be used, such as stacked nitride/polyimide layers, stacked oxide/polyimide layers, or simply a polyimide layer, or a layer or an other organic passivant.

In this example, the structure 10 comprises a substrate 12, having a plurality of metal wiring layers formed therein, of which only two, the last metal (LM) wiring layer and the last-metal-minus-one (LM−1) wiring layer are shown. The standard final passivation dielectric stack in this example comprises stacked oxide/nitride/polyimide layers 24, 26, 28 respectively. The metal wiring layers LM and LM−1 each comprise lines of copper or lines of another similarly used conductive material. At least one region of the last metal minus-one wiring layer LM−1 forms a fuse 14. The remaining regions of the metal wiring layer LM−1 may be electrically connected to lines in the last metal layer LM via interconnections (not shown) or connected to underlying conductors (not shown) in the substrate via interconnections (not shown).

An insulative layer 22, comprising oxide, is located between the last metal wiring layer LM and the etch-stop layer 30 over the last metal minus-one wiring layer LM−1. The etch-stop layer 30 may comprise nitride deposited by known techniques and having a thickness of approximately 10–100 nm. The insulative oxide layer 22 provides electrical insulation between the two metal layers and is deposited using known techniques.

Some lines in the last metal wiring layer LM may be electrically connected to contact pads 16 (e.g., a plurality of contact pads like contact pad 16). The contact pads 16 may be formed in a co-planer manner directly upon (not as shown) the metal surfaces of the LM lines. Alternatively the contact pads 16 may be separated from the LM line by one or more thin insulative layers (e.g., 23 and 21) and electrically connected to the underlying LM lines through smaller conductive interconnections passing through the insulative layers as shown, by known methods. The contact pads 16 may comprise aluminum, or other similar conductive materials.

Thin insulative layers 21 and 23 are successively formed upon the exposed surface of the line 15 in the last metal layer LM and upon the exposed portion of the insulative layer 22, using known techniques. In particular, thin insulative layer 23 comprises oxide, the insulative layer 21 comprises nitride. The thin insulative layers 21 and 23 will (for reasons which will become more evident 20 below) have an etch rate similar to that of the insulative layer 22 (and of layer 24).

In this example, the aluminum metal contact pad 16 is formed upon insulative layer 23 above the last metal line 15, and its interconnection extends down through a portion of the thin insulative layers 23 and 21 to make a physical and electrical contact with the underlying last metal line 15. A thin layer of titanium nitride (TiN) is deposited upon the aluminum surface of the contact pad 16. The TiN layer will function as a shield to protect the aluminum contact pad 16 from erosion due to etching while the overlying insulative layers (e.g., 24 and 26) are being completely removed above the contact pad 16.

A plurality of insulative layers 24, 26 and 28 are deposited over the TiN-coated surface of the contact pads 16, (and over the exposed portion of the thin insulative layer 23). In particular, insulative layer 24 comprises oxide, the insulative layer 26 comprises nitride, and insulative layer 28 comprises polyimide or an other organic passivant.

A layer of photoresist (not shown) is optionally deposited over the surface of the polyimide layer 28, or the polyimide layer 28 itself may serve as a resist/imaging layer. Using a first mask (not shown), openings are patterned within the polyimide layer 28 above the contact pads 16, and above the fuse 14. Using an appropriate etch process, either a wet etch or a reactive ion etch (RIE), the patterned openings are transferred into the polyimide layer 28, above the third insulative layer 26 as shown in FIG. 1.

Figure 2:
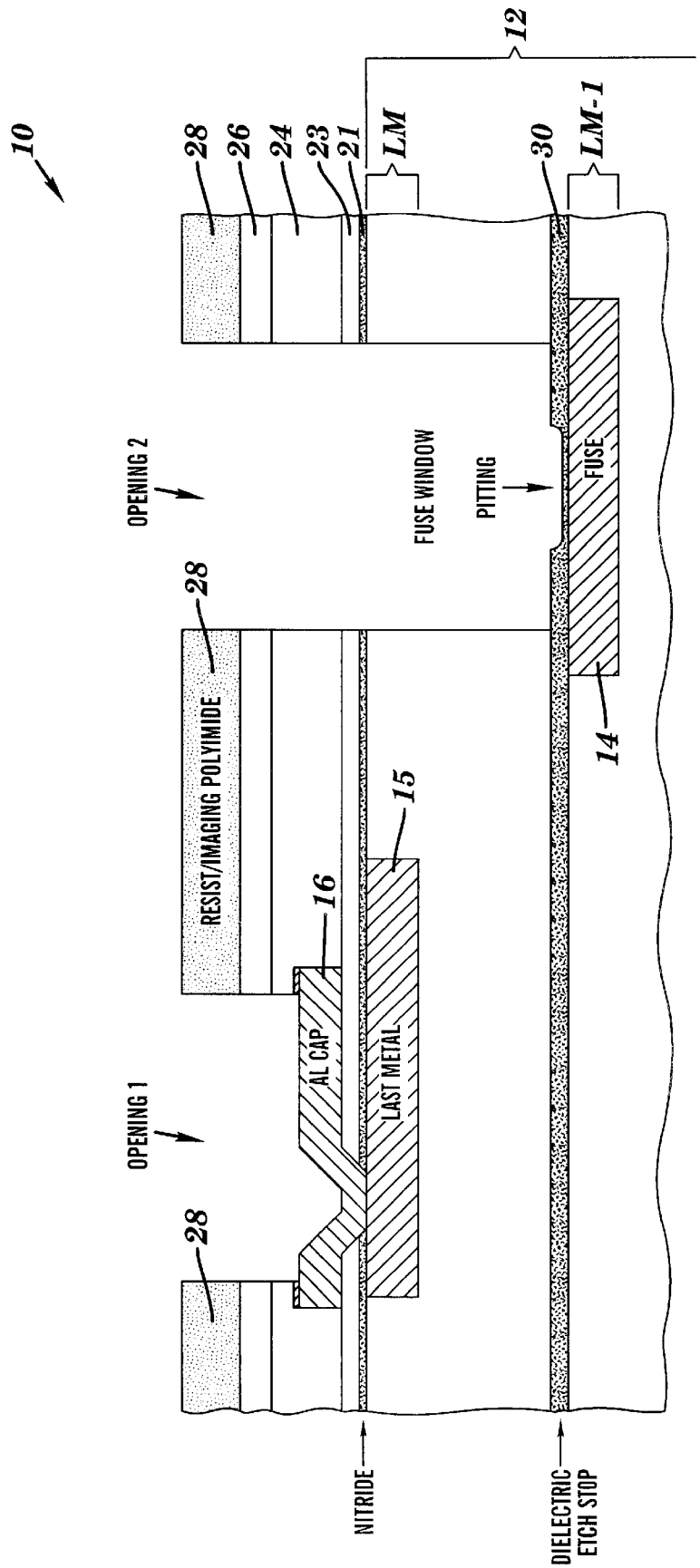
FIG. 2 depicts the related art structure of FIG. 1 following an etch.

As illustrated in FIG. 2, the portions of insulative layers 24 and 26 above the contact pads 16 and the fuse 14 are then etched. This etching may be performed using a dry RIE (Reactive Ion Etch). An "over-etch" is then performed to ensure that insulative oxide layer 24 is removed from above the surface of the metal contact pads 16 thereby providing for sufficient electrical contact. (An etch will subsequently be employed to remove the thin TiN layer from the aluminum contact pad.) During the over-etch, the insulative layer 24 etch chemistries are continually performed to remove any excess portions of the insulative layer 24 over the contact pads 16, thereby exposing the TiN layer on the surface of the contact pads 16. The TiN layer will remain to function as a shield to protect the aluminum contact pad 16 from erosion due to etching while any remainder of insulative layers (e.g., 22, 23 and 21) are being removed over the fuse 14.

Depending upon the duration and location of termination of the over-etch, the amount of remaining insulative layer 22 covering the fuse 14 is non-uniform and often locally too thick to allow successful laser deletion of the fuse link. Further etching is performed to remove the remaining thickness of the portion of the insulative layers (23, 21 and 22) over the fuse 14, down to the etch-stop layer 30. Because the insulative layers 22, 21 and 23 each comprise material having an etch rate similar to that of the passivation layers (e.g., 24, 26) above the contact pads 16, during the over-etch the insulative layers 22, 21 and 23 over the fuse 14 may be etched down to the etch-stop layer 30. Regardless of the duration of the over-etch, and of any further etching necessary to completely remove the insulative oxide layer 22 over the fuses 14, the etch-stop layer 30 will not be removed because the material within the etch-stop layer 30 has a much slower etch rate than that of the overlying insulative oxide layer 22.

Following over-etch and the removal of the insulative layers (e.g., 24, 23, 21 and 22) over the etch-stop layer 30 above fuse 14, both the TiN layer above the aluminum contact pad 16 and the etch-stop layer 30 over the fuse 14 are exposed. The TiN layer upon the aluminum contact pads 16 must be removed in order to expose the bare aluminum metal surfaces of the contact pads 16. The TiN layer may be removed by etching using an etch chemistry such as a wet etch chemistry that is effective to remove TiN but that does not etch aluminum. The etch of TiN also tends to undesirably thin and erode the already thin etch-stop layer 30 above the fuse 14. Because the etch rate of titanium nitride in the TiN layer may be equal to or slower than the etch rate of the material (e.g., nitride) in the etch-stop layer 30, after a complete removal of the TiN layer from the contact pad 16, the amount of remaining etch-stop layer 30 covering the fuse 14, if not completely removed, can be non-uniform and often too thin to protect the underlying fuse 14 from corrosion due to exposure to ambient conditions of the processing and packaging environments.

Thereafter, a laser fuse deletion process, which is used to open the fuse 14, is performed. The input conditions, including the necessary input power of the laser, the shape and diameter of the laser beam, etc., are programmed based upon the fuse 14 having the greatest predetermined thickness of etch-stop layer 30. Control software directs a laser (e.g., and infra red laser beam) to the fuse 14 to be deleted. Thereafter, the laser emits a beam, having a specified amount of energy, through the remaining etch-stop layer 30 above each fuse 14 to be deleted.

However, due to the possibly of complete removal of the etch-stop layer 30, or unequal etching of the nitride layer 30 above one fuse 14 compared to the etching of the nitride layer 30 above another fuse 14, which may result during etching of the TiN layer as aforesaid, some fuse positions will receive excessive laser input energy, which may lead to excessive insulator cracking or substrate damage. This is particularly problematic when the materials below the fuse 14 comprise low-k dielectric materials, which typically exhibit greater processing variability.

The present invention overcome these and other problems.

Figure 3:
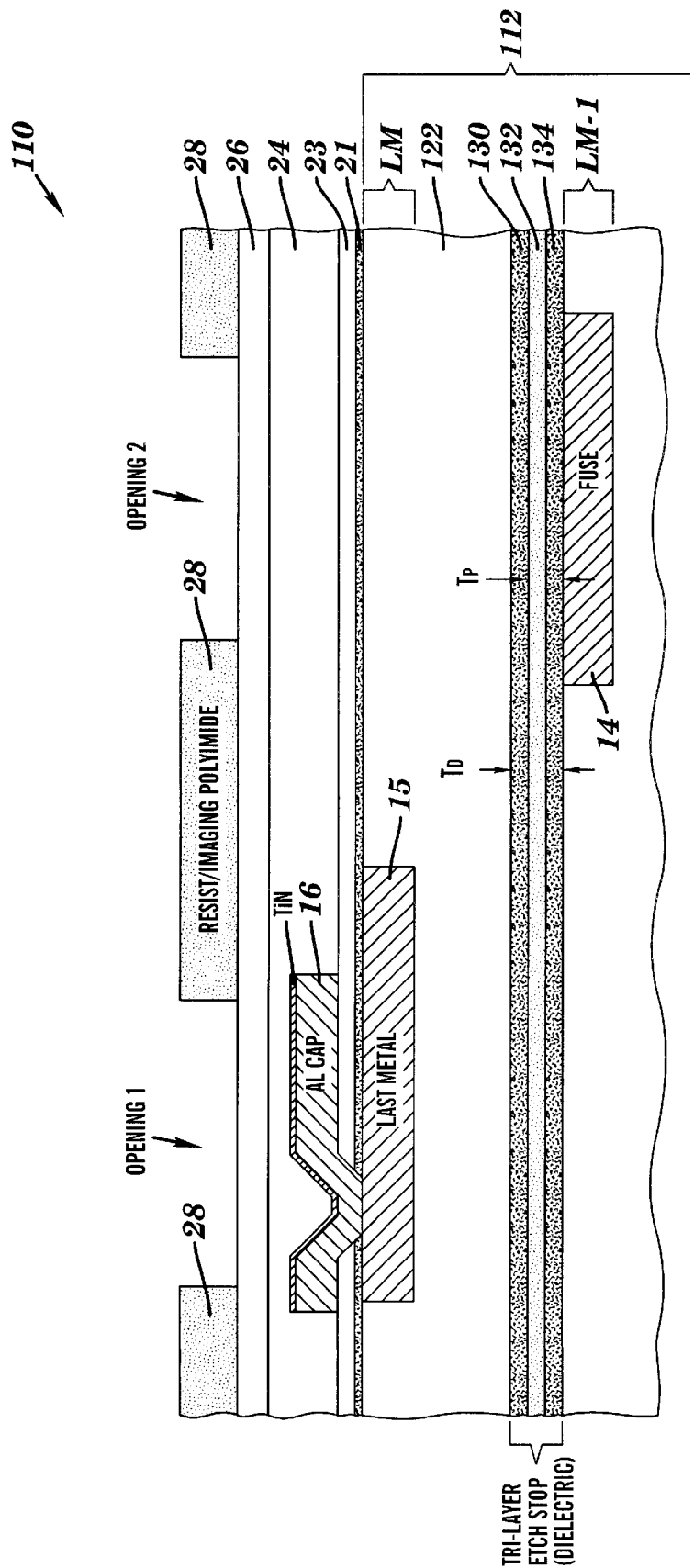
FIG. 3 depicts a cross-sectional view of an electronic structure made in accordance with embodiments of the present invention.

FIG. 3 shows a cross-sectional view of an electronic structure 110 in accordance with embodiments of the present invention. The structure 110 is a multilayered Back-End-of-the-Line (BEOL) electronic interconnect structure that includes a standard final passivation dielectric stack and (e.g., comprising insulative layers 28, 26 and 24) over a substrate 112 which includes a last metal layer LM and a tri-layer dielectric stack (comprising layers 130, 132 and 134) located above a fuse 14 in a last metal minus-one layer LM−1.

Any known standard final passivation dielectric stack could be used, such as stacked nitride/polyimide layers, stacked oxide/polyimide layers, or simply a polyimide layer. The standard final passivation dielectric stack in this example comprises stacked oxide/nitride/polyimide layers 24, 26, 28 respectively. In particular, insulative layer 24 comprises oxide, the insulative layer 26 comprises nitride, and insulative layer 28 comprises polyimide. The plurality of insulative layers 24, 26 and 28 are deposited over the TiN-coated surface of the contact pads 16, and over the exposed portion of the thin insulative layer 23.

A layer of photoresist (not shown) is optionally deposited over the exposed surface of the polyimide layer 28, or the polyimide layer 28 itself may serve as a resist/imaging layer. Using a first mask (not shown), openings (e.g., Opening1 and Opening2) are patterned within the polyimide layer 28 above a portion of the contact pads 16, and above a portion of the fuse 14. Using an appropriate process, (e.g., a wet etch or a reactive ion etch (RIE)), the patterned openings (Opening1 and Opening2) are transferred into the polyimide layer 28, above the insulative layer 26 as shown in FIG. 3.

In this example, the structure 110 comprises a substrate 112 having a plurality of metal wiring layers formed therein, of which only two, the last metal (LM) wiring layer LM and the last-metal-minus-one (LM−1) wiring layer are shown. The metal wiring layers LM and LM−1 each comprise conducting elements or lines of copper or of another similarly used conductive material. At least one region of the last metal minus-one wiring layer LM−1 forms a fuse 14. The remaining regions of the metal wiring layer LM−1 may be electrically connected to lines in the last metal layer LM via vertical interconnections (not shown) or connected to underlying conductors (not shown) in the substrate via vertical interconnections (not shown).

During formation of the structure 110, a tri-layer dielectric stack (i.e., a sequence of films comprising three layers of dielectric materials stacked one upon the next) is formed above the last metal minus-one wiring layer LM−1, and particularly, over the fuse 14. The tri-layer dielectric stack comprises a first etch-stop layer 130, a second etch-stop layer 132, and a diffusion barrier layer 134, each of which layers may be deposited using a spin-on, CVD, PVD or other conventionally used deposition technique.

Each etch-stop layer (e.g., 130 and 132) is an etch-resistant layer and has a much slower etch rate relative to the etch-rate of the overlying insulative layers (e.g., 122 and/or 124). The first etch-stop layer 130 can have a thickness of approximately 10 nm to 100 nm (e.g., 50 nm) and comprise silicon nitride, silicon carbide, boron nitride, SiCN, or other similar material having a slower etch rate than that of the insulative layer 122 thereabove. The material of which first etch-stop layer 130 is formed may be etchable by a selective etching chemistry which is used to remove the TiN coating on the contact pads 16 and which does not significantly etch the material of which the second etch-stop layer 132 is formed. The second etch-stop layer 132 can have a thickness of approximately 10 nm to 100 nm (e.g., 50 nm) and may comprise silicon oxide or an other similar material having a slower etch rate (in the etch chemistry selected to remove the TiN coating and/or the first etch-stop layer 130) than that of the material of which the first etch-stop layer 130 is formed. The diffusion barrier layer 134 may comprise a layer of silicon nitride, or silicon carbide, boron nitride, SiCN or similar material deposited by known techniques and having a thickness of approximately 0 nm to 100 nm (i.e., the range of zero thickness to one hundred nanometers). The diffusion barrier layer 134 may be omitted (i.e., have zero thickness) or have minimal thickness in embodiments of the invention wherein diffusion (e.g., copper diffusion) is not problematic (e.g., where a conductor other than copper is to be used to form the fuse 14). Where copper metal is used to form the fuse 14, the diffusion barrier layer 134 should comprise a layer of silicon nitride having a thickness of approximately 10 nm to 100 nm (e.g., 50 nm) measured in the area over the fuse 14 (e.g. in the area under Opening2).

The total deposition thickness $T_D$ of the tri-layer dielectric stack, which is the additive sum of the deposition thicknesses of each of the three layers 130, 132 and 134, can range between 30 nm to 300 nm, and will preferably be between 30 mn and 150 mn in the area over the fuse 14 to facilitate later laser deletion of the fuse 14 below. The thickness T of only the second etch-stop layer 132 plus the diffusion barrier layer 134 together should be between 10 nm and 150 nm in the area over the fuse 14, and preferably between approximately 10 nm and 100 nm, to protect the fuse from ambient conditions (as explained above) and to facilitate later laser deletion of the fuse 14 (as explained in more detail below). In alternative embodiments of the invention (not shown), the tri-layer dielectric stack described herein may be formed selectively within selected areas over the LM−1 layer, e.g., only within areas over each fuse 14 rather than over the entire plane of the LM−1 layer, and in such embodiments the thickness T recited would be measured within the areas over such fuses 14. Accordingly, the thickness T may be defined approximately as the sum of the deposition thicknesses of the second etch-stop layer 132 and of the diffusion barrier layer 134 within the area over a fuse 14. If in alternative embodiments of the invention any additional layers (other than a single diffusion barrier layer 134) are disposed between the second etch-stop layer 132 and the fuse 14, or in embodiments wherein the diffusion barrier layer 134 is omitted, then T will be measured as the thickness between the top of the second etch-stop layer 132 as deposited and the top of the fuse.

An insulative layer 122, comprising oxide, is located between the last metal wiring layer LM and the first etch-stop layer 130. The insulative oxide layer 122 provides electrical insulation between the two metal layers and is deposited using known techniques.

Some lines (e.g., 15) in the last metal wiring layer LM may be electrically connected to contact pads 16. The contact pads 16 may be formed in a co-planer manner directly upon (not as shown) the metal surfaces of the LM lines. Alternatively the contact pads 16 may be separated from the LM line by one or more thin insulative layers (e.g., 23 and 21) and electrically connected to the underlying LM lines (e.g. 15) through smaller conductive interconnections passing through the insulative layers as shown in FIG. 3, by known methods. The contact pads 16 may comprise aluminum, or other similar conductive materials.

In this example, the aluminum metal contact pad 16 is formed upon a thin insulative layer 23 above the last metal line 15, and its interconnection extends down through a portion of the thin insulative layers 23 and 21 to make a physical contact and electrical connection with the underlying last metal line 15. Thin insulative layers 21 and 23 are successively formed upon the top surface of the line 15 in the last metal layer LM and upon the exposed portion of the insulative layer 122, using known techniques. In particular, thin insulative layer 23 comprises oxide, the insulative layer 21 comprises nitride. The thin insulative layers 21 and 23 will preferably have an etch rate similar to that of the insulative layer 122 (and/or of layer 24), but will have an etch rate that is much higher than the etch rate of the TiN coating on the contact pad 16 during application of an etch chemistry suited for etching away insulative layers 24 and/or 122.

As previously noted, a thin layer of titanium nitride (TiN) is deposited upon the aluminum surface of the contact pad 16. The TiN layer will function later as a shield to protect the aluminum contact pad 16 from erosion due to later etching while the overlying insulative layers (e.g., 24 and 26) are being removed above the contact pad 16, and while underlying insulative layers 21, 122, and 122 are being removed above the fuse 14.

Figure 4:
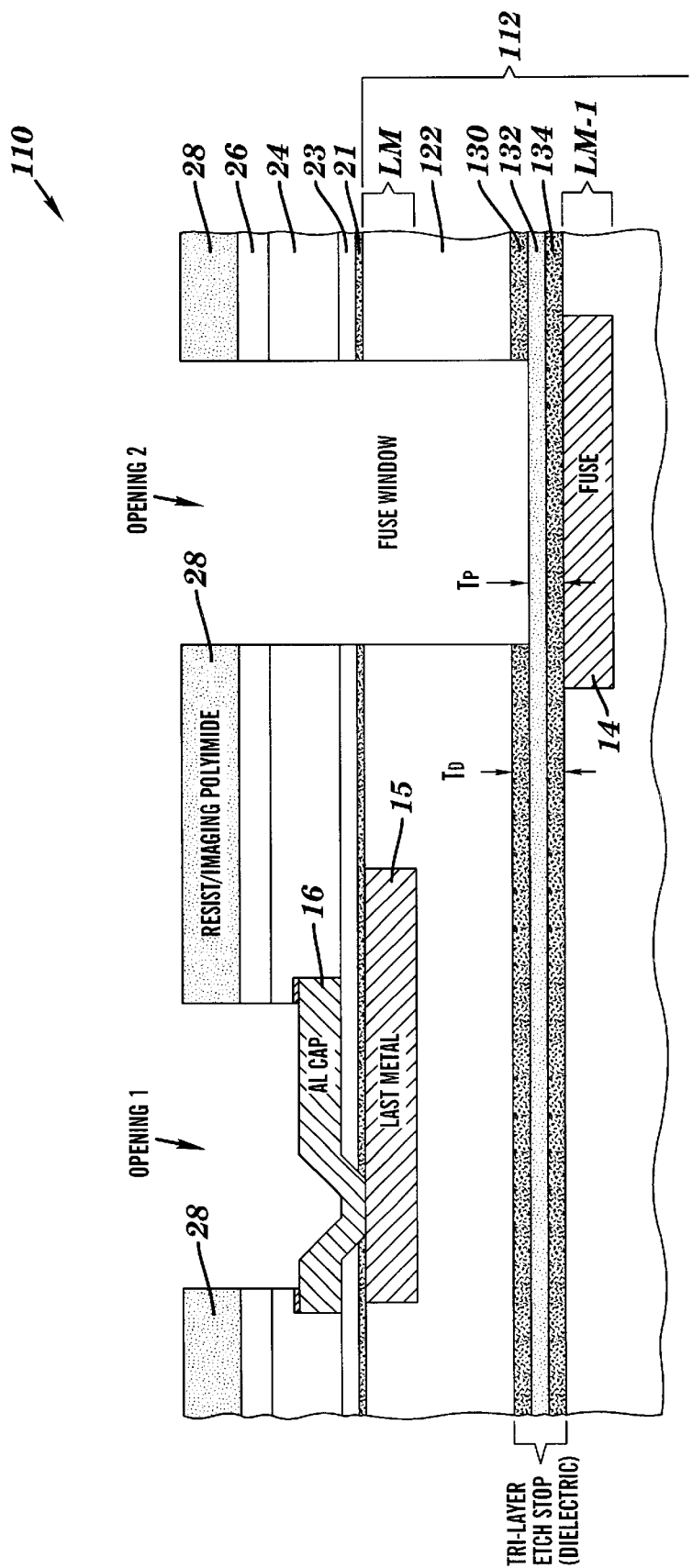
FIG. 4 depicts the electronic structure of FIG. 3 following a fuse-window etch.

As illustrated in FIG. 4, the portions of insulative layers 24 and 26 within the openings (e.g., Opening1 and Opening2) above the contact pads 16 and the fuse 14 are then etched. This etching may be performed using a dry RIE (Reactive Ion Etch). An "over-etch" is then performed to ensure that insulative oxide layer 24 is removed from above the surface of the metal contact pads 16 thereby providing for sufficient electrical contact. (An etch will subsequently be employed to remove the thin TiN layer from the aluminum contact pad.) During the over-etch, the insulative layer 24 etch chemistries are continually performed to remove any excess portions of the insulative layer 24 over the contact pads 16, thereby exposing the TiN layer on the surface of the contact pads 16. The TiN layer will remain temporarily to function as a shield to protect the aluminum contact pad 16 from erosion due to further etching while any remainder of intermediate insulative layers (e.g., 122, 23 and 21) are being removed over the fuse 14.

Depending upon the duration and location of termination of the over-etch, the amount of remaining insulative layer 122 covering the fuse 14 is non-uniform and often locally too thick to allow successful laser deletion of the fuse link. Therefore, further etching is performed to remove the remaining thickness of the portion of the insulative layers (23, 21 and 122) over the fuse 14, down to the first etch-stop layer 130. Because the insulative layers 122, 21 and 23 each comprise material having an etch rate similar to that of the passivation layers (e.g., 24, 26) above the contact pads 16, during the over-etch the insulative layers 122, 21 and 23 over the fuse 14 may be etched down to the first etch-stop layer 130. Regardless of the duration of the over-etch, and of any further etching necessary to completely remove the insulative oxide layer 122 over the fuses 14, the first etch-stop layer 130 will not be completely removed because the material within the first etch-stop layer 130 has a much slower etch rate than that of the overlying insulative oxide layer 122.

Following over-etch and the removal of the insulative layers (e.g., 24, 23, 21 and 122) down to the first etch-stop layer 130 above fuse 14, both the TiN layer above the aluminum contact pad 16 and the first etch-stop layer 130 over the fuse 14 are exposed. The TiN layer upon the aluminum contact pads 16 must be removed in order to expose the bare aluminum metal surfaces of the contact pads 16. The TiN layer may be removed by etching using an etch chemistry such as a wet etch chemistry that is effective to remove TiN but that does not etch aluminum. The etch of TiN also tends to thin and erode the already thin first etch-stop layer 130 above the fuse 14. Because the etch rate of titanium nitride over the contact pad 16 may be equal to or slower than the etch rate of the material (e.g., silicon nitride) in the first etch-stop layer 130, after a complete removal of the TiN layer from the contact pad 16, the amount of remaining first etch-stop layer 130 covering the fuse 14, if not completely removed, can be non-uniform and often too thin to protect the underlying 14 from corrosion due to exposure to ambient conditions of the processing and packaging environments.

It is previously explained, it is preferable that the post-etch thickness $T_P$ of the insulative material (i.e., the actual total thickness of stacked layers 130, 132 and 134 after removal of layer 122) above the fuse 14 be uniform and known among all fuses 14. A uniform post-etch passivation thickness $T_P$ will be less than or approximately equal to $T_D$, and $T_P$ will be greater than or approximately equal to T (where $T_D$ and T have been defined hereinabove). A uniform post-etch passivation thickness $T_P$ is readily achieved in the present invention. A uniform post-etch thickness $T_P$ approximately equal to T (the additive deposition thickness of the second etch-stop layer 132 plus any diffusion barrier layer 124), is obtained by etching away all the remaining first etch-stop layer 130 within the openings (e.g., Opening2) over the fuses 14, down to the top of the second etch-stop layer 130, using any known etch chemistry that will selectively etch the nitride (e.g., of layer 130) but which will not significantly etch aluminum (e.g., contact pad 16) nor oxide (e.g., layer 132).

Therefore, regardless of the amount of time spent performing the over-etch and/or the TiN etch, or the non-uniformity of these etches, the second etch-stop layer 132 will be minimally etched, if at all, leaving a known, uniform passivation thickness $T_P$ approximately equal to T (e.g., $T_P$ approximately equal to the deposition thickness of the second etch-stop layer 132 plus the diffusion barrier layer 134). This eliminates any need for the over-etch to be closely monitored and allows for the use of TiN or any other similar low-etch rate coating to be used to protect a metal surface (e.g., the aluminum surface of contact pad 16) during fabrication of the structure 110.

Thereafter, a laser fuse deletion process, which is used to open the fuse 14, is performed. The input conditions, including the necessary input power of the laser, the shape and diameter of the laser beam, etc., are programmed based upon the fuse 14 having the expected uniform post-etch thickness $T_P$ (e.g., $T_P$ approximately equal to T). Control software directs a laser (e.g., and infra red laser beam) to the fuse 14 to be deleted. Thereafter, the laser emits a beam, having an appropriate specified amount of energy, through the remaining second etch-stop layer 132 and through the diffusion barrier layer 134 above each fuse 14 to be deleted. Due to the uniformity of the passivation thickness $T_P$ over each fuse 14, stresses caused due to excessive input energy are reduced or eliminated. This is because the laser may be pre-programmed with the appropriate deletion energy required to blow a fuse 14 through a known thickness T that is approximately equal to the actual thickness $T_P$ from fuse 14 to fuse 14.

As the laser beam interacts with the metal fuse 14 material, the fuse 14 begins to heat up and expand, forcing the weakest regions surrounding the fuse 14 to rupture or explode. By design, the weakest region is intended to be the passivation thickness $T_P$ of the layers (e.g., 132 and 134) over the top of the fuse 14. Following the rupture, the molten metal within the fuse 14 vaporizes out of the LM–1 layer leaving a discontinuity within the metal wiring layer LM–1, which causes an intended high electrical resistance in that region of the structure 110.

Due to the clean removal of the first etch-stop layer 130 and a resulting uniform actual post-etch thickness $T_P$ (e.g., $T_P$ approximately equal to T) above one fuse 14 compared to the post-etch thickness above any other fuse 14, all fuse positions can receive the approximately the same laser input energy, which avoids the problem of excessive insulator cracking or substrate damage during fuse deletion. This is particularly useful when the materials below the fuse 14 comprise low-k dielectric materials.

It should be understood that the present invention has been illustrated and described in conjunction with an additional electrical feature, namely, contact pads 16, only as an example. Alternative embodiments of the invention may omit the contact pad 16, and omit the thin insulative layers 21 and 23, with a TiN coating disposed directly upon elements (e.g., 15) of the last metal layer LM, without departing from the teachings of the invention. The scope of the invention is in no way intended to be limited by the above description of an exemplary structure including a contact pad (e.g., 16), and/or the thin insulative layers (e.g., 21 and 23) disposed immediately thereunder. Rather, the present invention is also intended for use without, alone or in combination with its other various features.

While this invention has been described in conjunction with the specific embodiments outlined above, it is evident that many alternatives, modifications and variations will be apparent to those skilled in the art. For example, the layers in embodiments of the invention formed of silicon nitride may be instead formed of materials having similar properties, such as silicon carbide (SiC), silicon-carbide-nitride (SiCN), boron nitride etc. And, the layers in embodiments of the invention formed of silicon oxide may be instead formed of materials having similar properties, such as fluorosilicate glass (FSG). And, the layers in embodiments of the invention formed of titanium nitride may be instead formed of materials having similar properties, such as tungsten nitride (WN), or tantalum nitride (TaN), or refractory nitrides. And, the layers in embodiments of the invention formed of polyimide may be instead formed of materials having similar properties, such as organic passivants.

Accordingly, the embodiments of the invention as set forth above are intended to be illustrative, not limiting. Various changes may be made without departing from the spirit and scope of the invention as defined in the following claims.

We claim:

1. A method of forming a fuse structure, comprising:
   providing a fuse layer having a fuse formed therein;
   depositing a lower etch-resistant layer on an upper surface of the fuse layer and on an upper surface of the fuse;
   depositing an upper etch-resistant layer over the lower etch-resistant layer; and
   depositing an insulative layer containing a wiring line over the upper etch-resistant layer.

2. The method of claim 1, wherein the upper etch-resistant layer includes material selected from the group consisting of silicon carbide, boron nitride, SiCN and silicon nitride.

3. The method of claim 2, wherein the lower etch-resistant layer comprises silicon oxide.

4. A method of performing a fuse deletion, comprising:
   providing a metal fuse formed in a lower metal wiring layer, a lower etch-resistant layer formed on the fuse, providing an upper etch-resistant layer formed on and adjacent to the lower etch resistant layer and providing at least one upper insulative layer containing a wiring line formed on the upper etch-resistant layer;
   removing a portion of the at least one insulative layer above the fuse to the upper etch-resistant layer;
   removing a portion of the upper etch-resistant layer above the fuse to the lower etch-resistant layer; and
   applying radiant energy to the fuse until the fuse is deleted.

5. The method of claim 4, wherein removing a portion of the at least one insulative layer further comprises etching the insulative layer.

6. The method of claim 5, wherein the upper etch-resistant layer includes material selected from the group consisting of silicon carbide, boron nitride, SiCN and silicon nitride.

7. The method of claim 6, wherein the lower etch resistant layer comprises silicon oxide.

8. The method of claim 4, wherein the thickness between the top of the lower etch-resistant layer and the top of the fuse is approximately 10–100 nm.

9. The method of claim 4, wherein applying radiant energy comprises emitting a laser beam into the fuse.

10. The method of claim 5, further including forming a diffusion barrier layer between the lower etch-resistant layer and the fuse.

11. The method of claim 5, wherein removing the portion of the upper etch-resistant layer above the fuse to the lower etch-resistant layer provides a uniform passivation thickness over the fuse.

12. The method of claim 11, wherein the uniform passivation thickness over the fuse is approximately 50 to approximately 100 nanometers.

13. The method of claim 1, further including forming a diffusion barrier layer between the lower etch-resistant layer and the surface of the fuse layer and the surface of the fuse.

14. The method of claim 13, wherein the diffusion barrier layer includes material selected from the group consisting of silicon carbide, boron nitride, SiCN and silicon nitride.

15. The method of claim 10, wherein the diffusion barrier layer includes material selected from the group consisting of silicon carbide, boron nitride, SiCN and silicon nitride.

* * * * *